United States Patent
Jeong

(10) Patent No.: US 8,168,993 B2
(45) Date of Patent: May 1, 2012

(54) LIGHT EMTTING DEVICE, METHOD FOR MANUFACTURING LIGHT EMITTING DEVICE, AND LIGHT EMITTING APPARATUS

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/097,968

(22) Filed: Apr. 29, 2011

(65) Prior Publication Data

US 2011/0207252 A1 Aug. 25, 2011

Related U.S. Application Data

(63) Continuation of application No. 12/720,385, filed on Mar. 9, 2010, now Pat. No. 7,956,376.

(30) Foreign Application Priority Data

Mar. 10, 2009 (KR) ........................ 10-2009-0020133

(51) Int. Cl.
*H01L 33/00* (2010.01)
*H01L 27/15* (2006.01)

(52) U.S. Cl. ................ 257/98; 257/79; 257/94; 257/99; 257/E33.068; 257/E33.069; 257/E33.074; 438/29; 438/33; 438/460; 438/462; 438/464

(58) Field of Classification Search .................... 257/79, 257/94, 98, 99, E33.068, E33.069, E33.074; 438/29, 33, 460, 462, 464
See application file for complete search history.

(56) References Cited

U.S. PATENT DOCUMENTS

| | | | |
|---|---|---|---|
| 7,564,069 B2 * | 7/2009 | Shei | 257/94 |
| 2005/0199891 A1 | 9/2005 | Kunisato et al. | |
| 2005/0285130 A1 | 12/2005 | Hsieh | |
| 2006/0273335 A1 | 12/2006 | Asahara et al. | |
| 2007/0194325 A1 | 8/2007 | Sung et al. | |
| 2007/0194341 A1 | 8/2007 | Chang et al. | |
| 2007/0221907 A1 | 9/2007 | Jang et al. | |
| 2008/0258161 A1 * | 10/2008 | Edmond et al. | 257/98 |
| 2009/0134418 A1 | 5/2009 | Lee | |
| 2009/0206362 A1 * | 8/2009 | Sung et al. | 257/103 |
| 2010/0084682 A1 | 4/2010 | Lee et al. | |
| 2011/0278628 A1 | 11/2011 | Lee | |

FOREIGN PATENT DOCUMENTS

| | | |
|---|---|---|
| CN | 101084583 A | 12/2007 |
| KR | 20-0379693 Y1 | 3/2005 |
| KR | 10-2008-0048707 A | 6/2008 |
| KR | 10-2009-0015633 A | 2/2009 |
| WO | 2006/043796 A1 | 4/2006 |
| WO | 2007/124708 A1 | 11/2007 |

* cited by examiner

*Primary Examiner* — Dao H Nguyen
(74) *Attorney, Agent, or Firm* — Birch, Stewart, Kolasch & Birch, LLP

(57) ABSTRACT

A light emitting device according to the embodiment includes a reflecting layer; an adhesion layer including an oxide-based material on the reflecting layer; an ohmic contact layer on the adhesion layer; and a light emitting structure layer on the ohmic contact layer.

20 Claims, 6 Drawing Sheets

LIGHT EMTTING DEVICE, METHOD FOR MANUFACTURING LIGHT EMITTING DEVICE, AND LIGHT EMITTING APPARATUS

CROSS-REFERENCE TO RELATED APPLICATIONS

This application is a Continuation of U.S. Patent Application No. 12/720,385 filed on Mar. 9, 2010 now U.S. Pat. No. 7,956,376, which claims priority under 35 U.S.C. §119(a) of Korean Patent Application No. 10-2009-0020133 filed on Mar. 10, 2009, which is hereby incorporated by reference in its entirety.

BACKGROUND

Embodiments relate to a light emitting device, a method for manufacturing a light emitting device, and a light emitting apparatus.

A light emitting diode (LED) is a sort of a semiconductor device that converts electric energy into light. The LED has advantages of low power consumption, semi-permanent lifespan, rapid response speed, safety, environmental-friendliness as compared to existing light sources such as a fluorescent lamp, an incandescent lamp, etc. Many researches in replacing the existing light sources with the LED have been progressed. The LED is being increasingly used as a light source for an illumination apparatus of various lamps to be used in or out of a room, a liquid crystal display device, an electronic display board, a streetlight, and the like.

SUMMARY

Embodiments provide a light emitting device having a new structure, a method for manufacturing a light emitting device, and a light emitting apparatus.

Embodiments provide a light emitting device with improved light extracting efficiency, a method for manufacturing a light emitting device, and a light emitting apparatus.

Embodiments provide a light emitting device that can prevent materials used as a reflecting layer from diffusing to a light emitting structure layer, a method for manufacturing a light emitting device, and a light emitting apparatus.

In one embodiment, a light emitting device includes: a reflecting layer; an adhesion layer including an oxide-based material on the reflecting layer; an ohmic contact layer on the adhesion layer; and a light emitting structure layer on the ohmic contact layer.

In another embodiment, a light emitting apparatus includes; a body; a first electrode and a second electrode on the body; a light emitting device electrically connected to the first electrode and the second electrode on the body; and a sealing layer surrounding the light emitting device on the body, wherein the light emitting device includes a reflecting layer; an adhesion layer including an oxide-based material on the reflecting layer; an ohmic contact layer on the adhesion layer; and a light emitting structure layer on the ohmic contact layer.

In yet another embodiment, a method for manufacturing a light emitting device includes: forming a light emitting structure layer; forming an ohmic contact layer on the light emitting structure layer; forming an adhesion layer including an oxide-based material on the ohmic contact layer; and forming a reflecting layer on the adhesion layer.

DETAILED DESCRIPTION OF THE EMBODIMENTS

Figure 1:
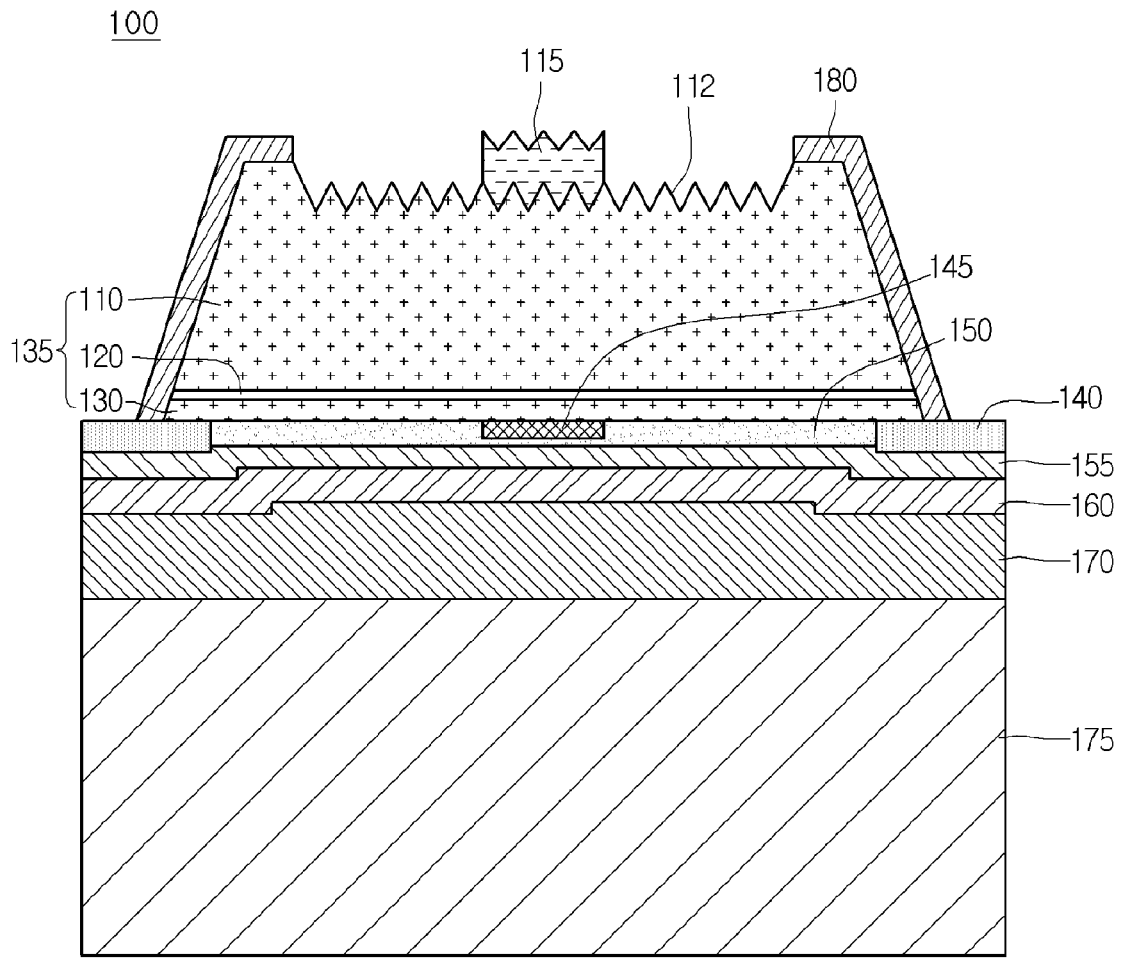
FIG. 1 is a diagram for explaining a light emitting device according to an embodiment.

In describing embodiments, it will be understood that when each layer (or film), region, pattern, or structure is described to as being formed 'on' or 'under' each layer (or film), region, pattern, or structure, "on" or "under" can be formed "directly" or via other layer (indirectly)". In addition, word "on," or "under," are will be described based on the accompanying drawings.

In the drawings, the thickness or size of each layer is exaggerated, omitted, or schematically illustrated for convenience in description and clarity. Also, a size of each component does not entirely reflect an actual size.

Hereinafter, a light emitting diode, a method for manufacturing a light emitting diode, a light emitting device will be described with reference to the accompanying drawings.

FIG. 1 is a diagram for explaining a light emitting device according to an embodiment.

Referring to FIG. 1, a light emitting device 100 according to an embodiment includes a conductive supporting substrate 175, a bonding layer 170 that is formed on the conductive supporting substrate 175, a reflecting layer 160 that is formed on the bonding layer 170, an adhesion layer 155 that is formed on the reflecting layer 160, an ohmic contact layer that is formed on the adhesion layer 155, a protective layer 140 that is formed at a peripheral region on an upper surface of the adhesion layer 155, a light emitting structure layer 135 that is formed on the ohmic contact layer 150 and the protective layer 140 to generate light, a passivation layer 180 that protects the light emitting structure layer 135, a current blocking layer 145 that is formed between the ohmic contact layer 150 and the light emitting structure layer 135, and an electrode 115 that is formed on the light emitting structure layer 135.

The conductive supporting substrate 175 supports the light emitting structure layer 135 and can supply power to the light emitting structure layer 135 along with the electrode 115. The conductive supporting substrate 175 may include at leas one of, for example, copper (Cu), gold (Au), nickel (Ni), molybdenum (Mo), copper-tungsten (Cu—W), and carrier wafer (for example, Si, Ge, GaAs, ZnO, Sic, etc.).

A thickness of the conductive supporting substrate 175 can be changed according to a design of the light emitting device 100. For example, the conductive supporting substrate 175 may have a thickness of, for example, 50 μm to 300 μm. The conductive supporting substrate 175 is not necessarily formed and may be omitted according to the structural change of the light emitting device 100. For example, the reflecting layer 160 is formed thickly, such that the conductive supporting substrate 175 may not be formed.

The bonding layer 170 may be formed on the conductive supporting substrate 175. The bonding layer 170 is formed under the reflecting layer 160. The bonding layer 170 may be strongly bonded to the reflecting layer 160 and the conductive supporting substrate 175. The bonding layer 170 includes a barrier metal, a bonding metal, etc. For example, the bonding layer 170 may include at least one of Ti, Au, Sn, Ni, Cr, Ga, In, Bi, Cu, Ag, and Ta.

The embodiment shows the case where the conductive supporting substrate 175 is coupled to the reflecting layer 160 in a bonding manner. However, the conductive supporting substrate 175 may be formed on the reflecting layer 160 in a plating manner. In this case, the bonding layer 170 may be replaced as a seed layer for plating. In other words, after the seed layer is formed on the reflecting layer 160, the conductive supporting substrate 175 may be formed thereon through the plating. The conductive supporting substrate 175 may be made of a platable metal material. For example, the seed layer may include at least one of Au, Cu, Mo, Pt, and W.

The reflecting layer 160 may be formed on the bonding layer 170. The reflecting layer 160 reflects light input from the light emitting structure layer 135, thereby making it possible to improve the light extracting efficiency.

The reflecting layer 160 may be made of metal including at least one of Ag, Ni, Al, Rh, Pd, Ir, Ru, Mg, Zn, Pt, Cu, Au, and Hf or an alloy thereof. In addition, the reflecting layer 160 may be formed of a multi-layer using the above-mentioned metals or alloy thereof and transmitting and conductive materials such as IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), ATO (Antimony-Tin-Oxide) etc. For example, in the embodiment, the reflecting layer 160 may include at least one of Ag, Al, an alloy of Ag—Pd—Cu, and an alloy of Ag—Cu.

The adhesion layer 155 is formed on the reflecting layer 160. The adhesion layer 155 strengths the adhesion of the reflecting layer 160 and the ohmic contact layer 150. The adhesion layer 155 may includes an oxide-based material. In this case, it improves transmittance, thereby making it possible to reduce light amount absorbed in the adhesion layer 155 as well as increase light amount reflected and extracted from the reflecting layer 160. For example, in the embodiment, the adhesion layer 155 may be made of AZO or IZO. When the adhesion layer 155 is made of AZO or IZO, the adhesion layer 155 may be formed thickly, which can prevent a material such as Ag used as the reflecting layer 160 from diffusing to the light emitting structure layer 135. For example, a content of composition of ZO (Zinc-Oxide) in AZO or IZO may be 50% to 80%, thereby making it possible to improve transmittance.

The ohmic contact layer 150 is formed on the adhesion layer 155. The ohmic contact layer 150 ohmic-contacts a second conductive type semiconductor layer 130 of the light emitting structure layer 135 to efficiently supply power to the light emitting structure layer 135 and may be formed of a single layer or a multi-layer including at least one of ITO, IZO, IZTO, IAZO, IGZO, IGTO, AZO, ATO, IrO, RuO, RuO/ITO, Ni, Ag, Ni/IrO/Au, and Ni/IrO/Au/ITO. For example, in the embodiment, the ohmic contact layer 150 may be made of ITO.

The embodiment shows the case where the ohmic contact layer 150 contacts the lower and side surfaces of the current blocking layer 145 but the ohmic contact layer 150 may be disposed to be spaced from the current blocking layer 145 or contact only the side surface of the current blocking layer 145.

The current blocking layer (CBL) 145 may be formed between the ohmic contact layer 150 and the second conductive type semiconductor layer 130. The upper surface of the current blocking layer 145 contacts the second conductive type semiconductor layer 130 and the lower and side surfaces of the current blocking layer 145 contact the ohmic contact layer 150.

The current blocking layer 145 may overlap with the electrode 115 in a vertical direction. Thereby, a phenomenon that current is concentrated to a shortest distance between the electrode 115 and the conductive supporting substrate 175 is relieved, thereby making it possible to improve the light emitting efficiency of the light emitting device 100. The current blocking layer 145 may be selectively formed and may be omitted according to the design of the light emitting device 100.

The current blocking layer 145 is made of a material having electric conductivity lower than the ohmic contact layer 150 and a material that forms a schottky contact with the second conductive type semiconductor layer 130, or an electric insulating material. For example, the current blocking layer 145 may be made of at least one of ZnO, $SiO_2$, $SiO_xN_y$, $Si_3N_4$, $Al_2O_3$, $TiO_x$, Ti, Al, and Cr.

The protective layer 140 may be formed at a peripheral region of the upper surface of the adhesion layer 155. In other words, the protective layer 140 may be formed at the peripheral region between the light emitting structure layer 135 and the adhesion layer 155 and may be the conductive protective layer made of a material having conductivity or a non-conductive protective layer made of a material having non-conductivity. The protective layer 140 may be selectively formed and may be omitted according to the structure of the light emitting device 100.

The conductive protective layer is formed of a transparent conductive oxide film or may include at least one of Ti, Ni, Pt, Pd, Rh, Ir, and W. When the conductive protective layer is subject to an isolation etching in order to separate the light emitting structure layer 135 into a unit chip in a chip separating process, fragments are generated in the adhesion layer 155 and are attached between the second conductive type semiconductor layer 130 and the active layer 120 or between the active layer 120 and the first conductive type semiconductor layer 110, thereby preventing the occurrence of electrical short. Therefore, the conductive protective layer is made of a material that prevents the conductive protective layer from being broken or the fragments from being generated when the isolation etching is performed. Since the conductive protective layer has the electric conductivity, current may be injected to the light emitting structure layer 135 through the conductive protective layer. Therefore, light can be effectively generated even in the active layer 120 that is disposed on the conductive protective layer disposed at a peripheral region of the light emitting structure layer 135 and the light efficiency of the light emitting device can be improved. In addition, the conductive protective layer prevents the increase in the operating voltage by the current blocking layer 145, thereby making it possible to lower the operating voltage of the light emitting device. The conductive protective layer may be made of the same material as the ohmic contact layer 150.

The non-conductive protective layer may be made of a material having substantially electric insulating property due to very low electric conductivity. The non-conductive protective layer may be made of an electric insulating material. For example, the non-conductivity protective layer may be made of ZnO or $SiO_2$. The non-conductive protective layer increases the distance between the adhesion layer 155 and the active layer 120. Therefore, the possibility of causing the electrical short between the adhesion layer 155 and the active layer 120 can be reduced. When the non-conductive protective layer is subject to an isolation etching in order to separate the light emitting structure layer 135 into a unit chip in a chip separating process, the fragments are generated in the adhesion layer 155 and are attached between the second conductive type semiconductor layer 130 and the active layer 120 or between the active layer 120 and the first conductive type semiconductor layer 110, thereby preventing the occurrence of electrical short. The non-conductive protective layer is made of a material that prevents the non-conductive protective layer from breaking or prevents the occurrence of the fragments during the etching or a material having the electric insulating property that prevents the electrical short even though a very small portion of the non-conductive protective layer is broken a small amount of fragments occur.

A portion of the protective layer 140 overlaps with the light emitting structure layer 135 in a vertical direction.

The light emitting structure layer 135 may be formed on the ohmic contact layer 150 and the protective layer 140.

An inclined surface may be formed on the side surface of the light emitting structure layer 135 during the isolation etching process that separates the light emitting structure layer 135 into a plurality of unit chips.

A portion of the upper surface of the protective layer 140 may be exposed by the isolation etching. Therefore, a portion of the protective layer 140 overlaps with the light emitting structure layer 135 in a vertical direction and the remaining region thereof does not overlap with the light emitting structure layer 135 in a vertical direction.

The light emitting structure layer 135 may include a compound semiconductor layer of a plurality of elements of III group to V group and may include, for example, the first conductive type semiconductor layer 110, the active layer 120 under the first conductive type semiconductor layer 110, and the second conductive type semiconductor layer 130 under the active layer 120.

The first conductive type semiconductor layer 110 may be selectively made of compound semiconductors of elements of III group to V group doped with a first conductive type dopant, for example, GaN, AlN, AlGaN, InGaN, InN, InAlGaN, AlInN, AlGaAs, GaP, GaAs, GaAsP, AlGaInP, etc. When the first conductive type semiconductor layer 110 is an N type semiconductor layer, the first conductive dopant includes an N type dopant such as Si, Ge, Sn, Se, Te, etc. The first conductive type semiconductor layer 110 may be formed of a single layer or a multi-layer but is not limited thereto.

The active layer 120 is formed under the first conductive type semiconductor layer 110 and may include a single quantum well structure, a multi-quantum structure (MQW), a quantum dot structure, and a quantum wire structure. The active layer 120 may be formed of a well layer and a barrier layer using a compound semiconductor material of III group to V group elements, for example, an InGaN well layer/GaN barrier layer or an InGaN well layer/AlGaN barrier layer.

A clad layer may be formed between the active layer 120 and the first conductive semiconductor layer 110 or between the active layer 120 and the second conductive type semiconductor layer 130 and the clad layer may be made of an AlGaN-based semiconductor.

The second conductive type semiconductor layer 130 is formed under the active layer 120 and may be selectively made of compound semiconductors of elements of III group to V group doped with a second conductive type dopant, for example, GaN, AlN, AlGaN, InGaN, InN, InAlGaN, AlInN, AlGaAs, GaP, GaAs, GaAsP, AlGaInP, etc. When the second conductive type semiconductor layer 130 is a P type semiconductor layer, the second conductive dopant includes a P type dopant such as Mg, Zn, etc. The second conductive type semiconductor layer 130 may be formed of a single layer or a multi-layer but is not limited thereto.

Meanwhile, the light emitting structure layer 135 may further include an N-type semiconductor layer under the second conductive semiconductor layer 130. For example, the light emitting structure layer 135 may include at least one of an N-P junction structure, a P-N junction structure, an N-P-N junction structure, and a P-N-P junction structure.

The electrode 115 is formed on the light emitting structure layer 135. The electrode 115 may include a pad portion where a wire bonding is performed and a finger portion that is extended from the pad portion. The finger portion may be branched in a predetermined pattern shape and may be formed in various shapes.

The upper surface of the first conductive type semiconductor layer 110 may be formed with a roughness pattern 112 for the light extraction efficiency. Therefore, a roughness pattern may be formed even on the upper surface of the electrode 115 but is not limited thereto.

The passivation layer 180 may be formed on at least side surface of the light emitting structure layer 135. In addition, the passivation layer 180 may be formed on the upper surface of the first conductive type semiconductor layer 110 and the upper surface of the protective layer 140 but is not limited thereto.

The passivation layer 180 may be formed to electrically protect the light emitting structure layer 135.

Hereinafter, a method for manufacturing a light emitting device according to the embodiment will be described in detail. However, the repeated description of the above description will be omitted or schematically omitted.

FIGS. 2 to 11 are diagrams for explaining a method for manufacturing a light emitting device according to an embodiment.

Figure 2:
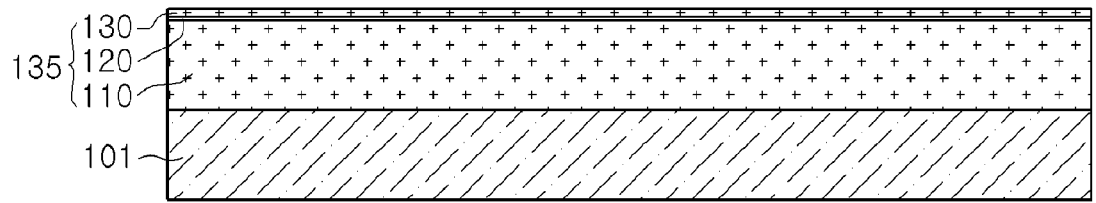
FIGS. 2 to 11 are diagrams for explaining a method for manufacturing a light emitting device according to an embodiment.

Referring to FIG. 2, the light emitting structure layer 135 is formed on a growth substrate 101. The growth substrate 101 may be made of at least one of, for example, sapphire ($Al_2O_3$), SiC, GaAs, GaN, ZnO, Si, GaP, InP, and Ge but is not limited thereto.

The light emitting structure layer 135 may be formed by growing the first conductive type semiconductor layer 110, the active layer 120, and the second conductive type semiconductor layer 130 on the growth substrate 101.

The light emitting structure layer 135 may be formed, for example, using a MOCVD (Metal Organic Chemical Vapor Deposition) method, a CVD (Chemical Vapor Deposition) method, a PECVD (Plasma-Enhanced Chemical Vapor Deposition) method, an MBE (Molecular Beam Epitaxy) method, an HVPE (Hydride Vapor Phase Epitaxy) method, etc., but is not limited thereto.

Meanwhile, a buffer layer (not shown) and/or an undoped nitride layer (not shown) may be formed to relieve lattice mismatch due to a lattice constant difference between the light emitting structure layer 135 and the growth substrate 101.

Figure 3:
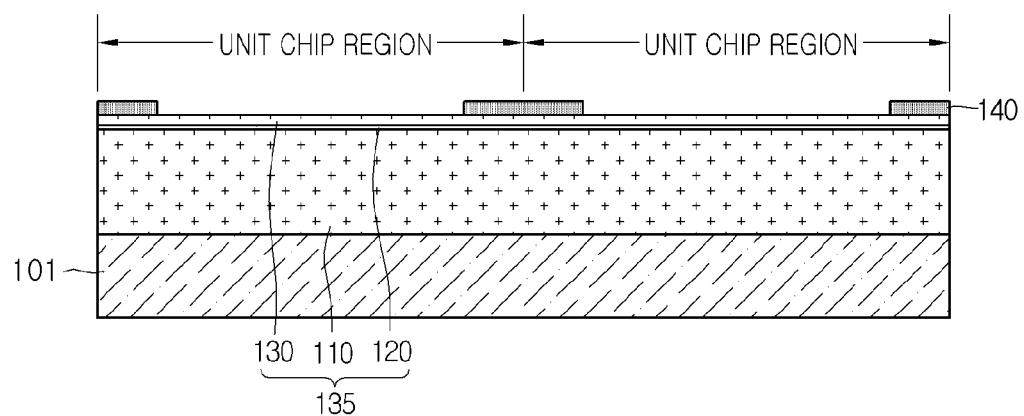

Referring to FIG. 3, the protective layer 140 is partially formed corresponding to a unit chip region on the light emitting structure layer 135.

The protective layer 140 may be formed at a circumference of the unit chip area using a mask pattern. The protective layer 140 may be formed using various deposition methods such as a sputtering method.

Figure 4:
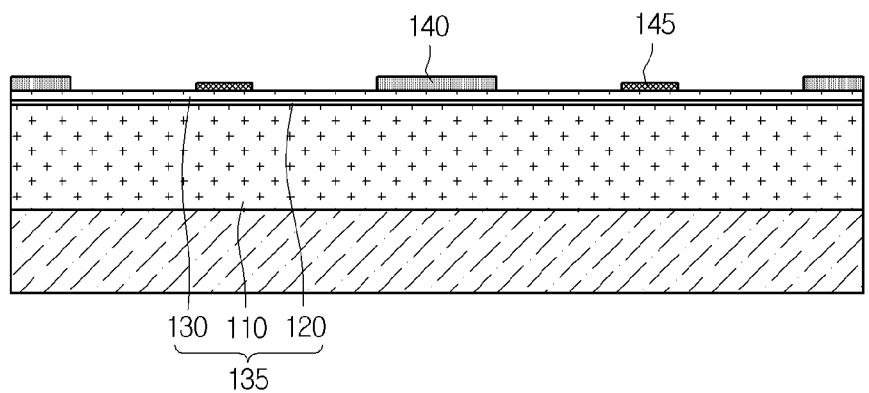

Referring to FIG. 4, the current blocking layer 145 may be formed on the second conductive type semiconductor layer 130. The current blocking layer 145 may be formed using a mask pattern.

The protective layer 140 and the current blocking layer 145 may be made of the same material. In this case, the protective layer 140 and the current blocking layer 145 may be simultaneously formed in one process without being formed in a separate process. For example, after an $SiO_2$ layer is formed on the second conductive type semiconductor layer 130, the protective layer 140 and the current blocking layer 145 may be simultaneously formed using the mask pattern.

Figure 5:
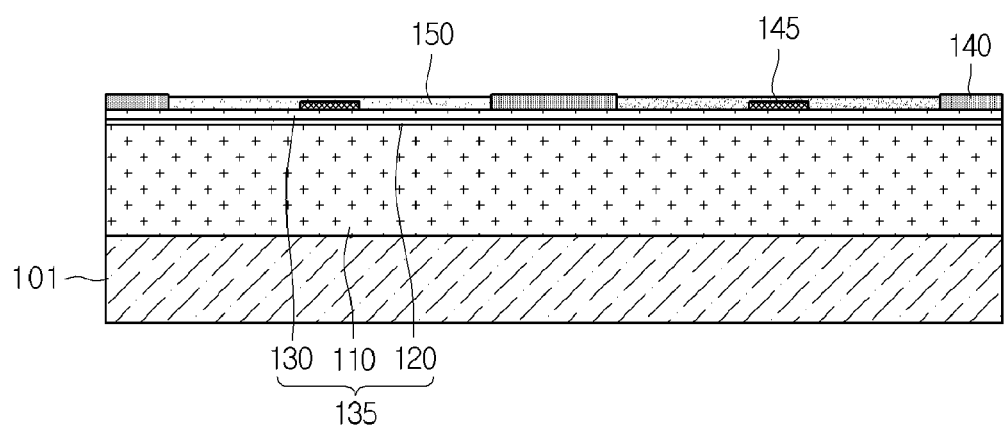

Referring to FIG. 5, the ohmic contact layer 150 is formed on the second conductive type semiconductor layer 130 and the current blocking layer 145. In addition, the ohmic contact layer 150 may be formed only on the second conductive semiconductor layer 130.

Figure 6:
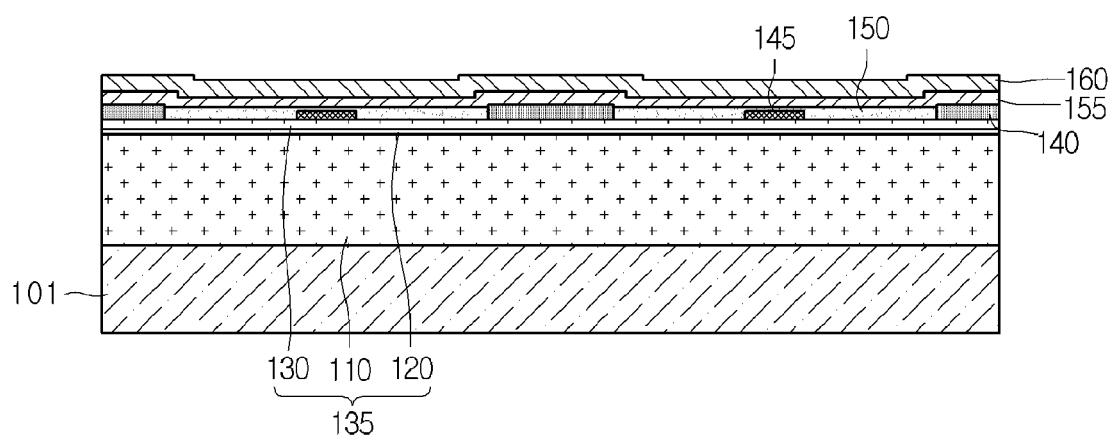

Referring to FIG. 6, the adhesion layer 155 and the reflecting layer 160 are formed on the ohmic contact layer 150.

The ohmic contact layer 150, the adhesion layer 155, and the reflecting layer 160 may be formed of any one of, for example, an E-beam method, a sputtering method, and a plasma enhanced chemical vapor deposition (PECVD) method.

Figure 7:
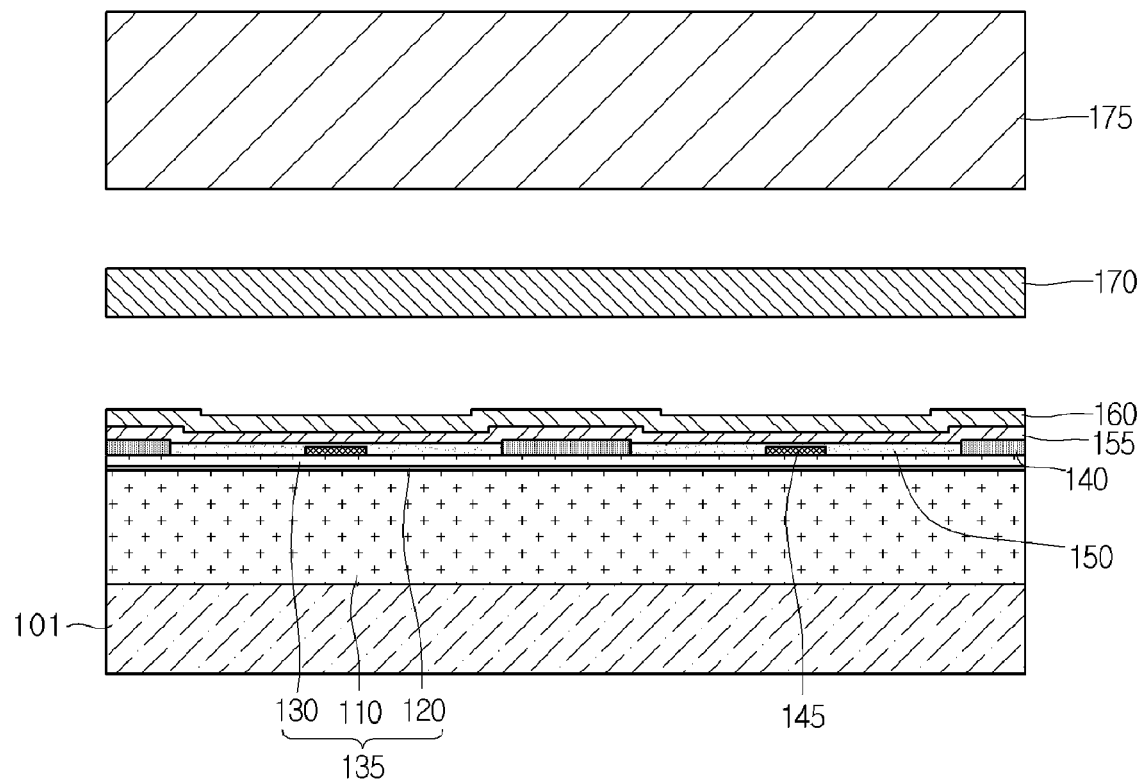
Figure 8:
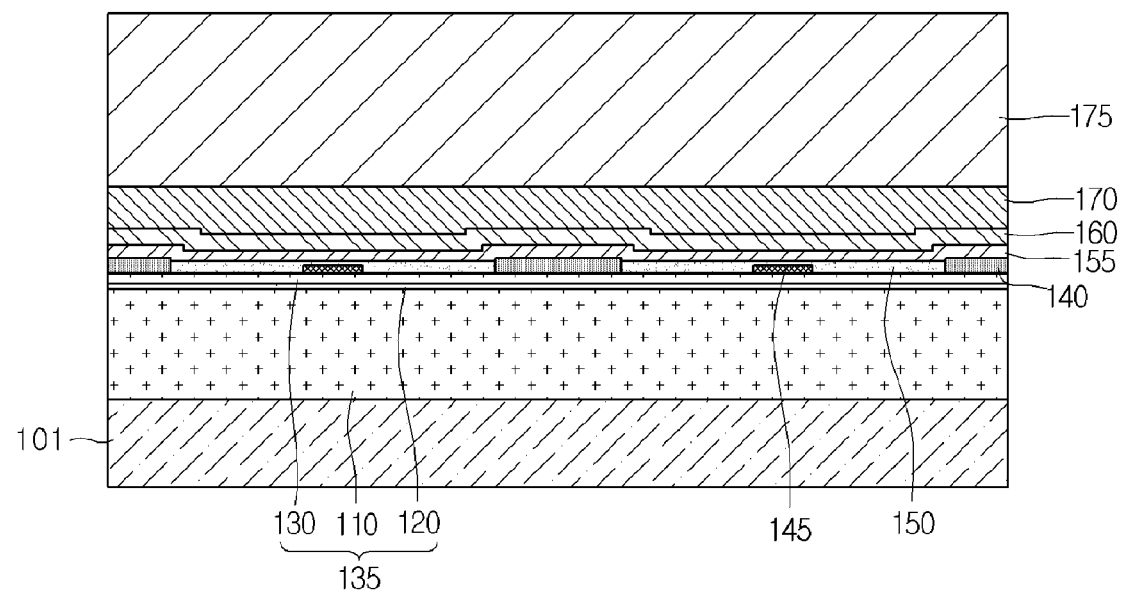

Referring to FIGS. 7 and 8, the conductive supporting substrate 175 is prepared.

The structure as shown in FIG. 6 and the conductive supporting substrate 175 are bonded to each to via the bonding layer 170.

The conductive supporting substrate 175 is attached by the bonding layer 170. Although the embodiment shows the case where the conductive supporting substrate 175 is coupled in the bonding manner through the bonding layer 170, the conductive supporting substrate 175 may be formed in the plating manner or the deposition manner. In this case, instead of the bonding layer 170, the seed layer can be used.

Figure 9:
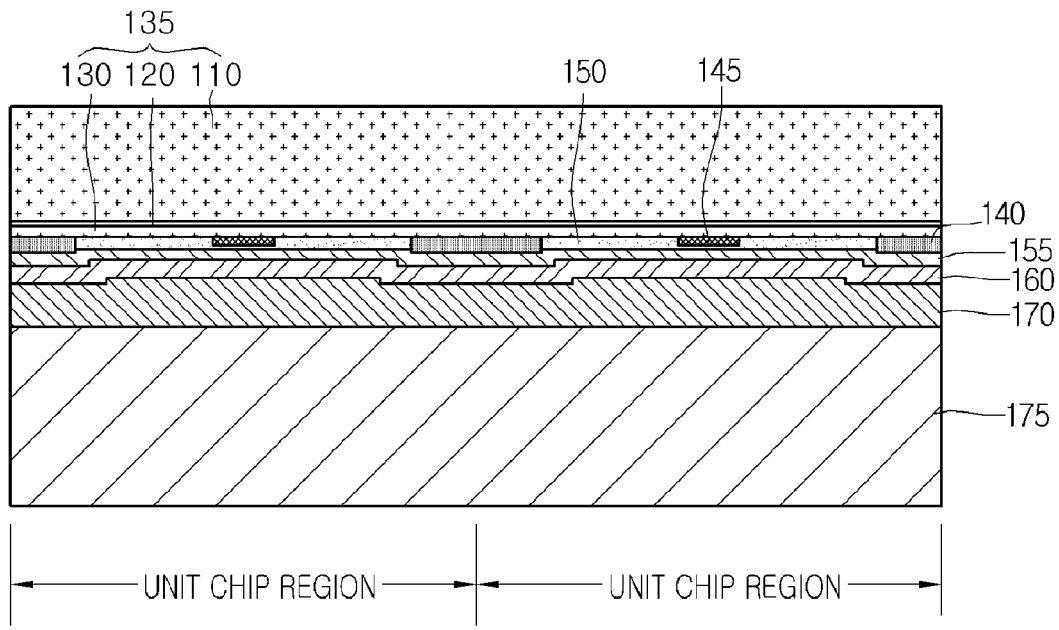

Referring to FIG. 9, the light emitting structure layer 135 is removed from the growth substrate 101. FIG. 9 shows the case where the structure shown in FIG. 8 is turned over.

The growth substrate 101 may be removed by a laser lift off method or a chemical lift off method.

Figure 10:
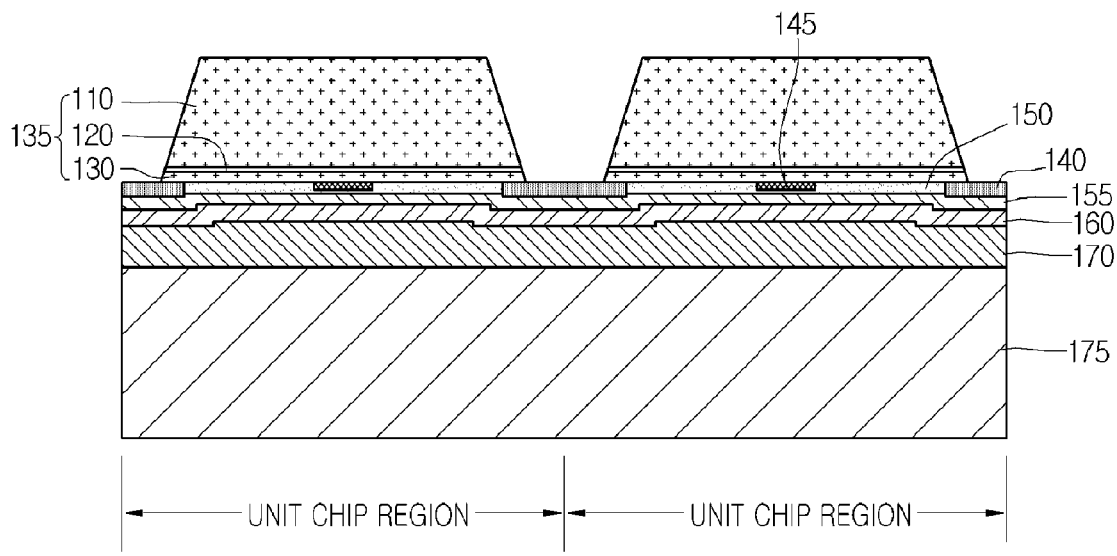

Referring to FIG. 10, the light emitting structure layer 135 is subject to the isolation etching along the unit chip region, such that the plurality of light emitting structure layer 135 is separated. For example, the isolation etching may be performed by a dry etching method such as an inductively coupled plasma (ICP) method.

Figure 11:
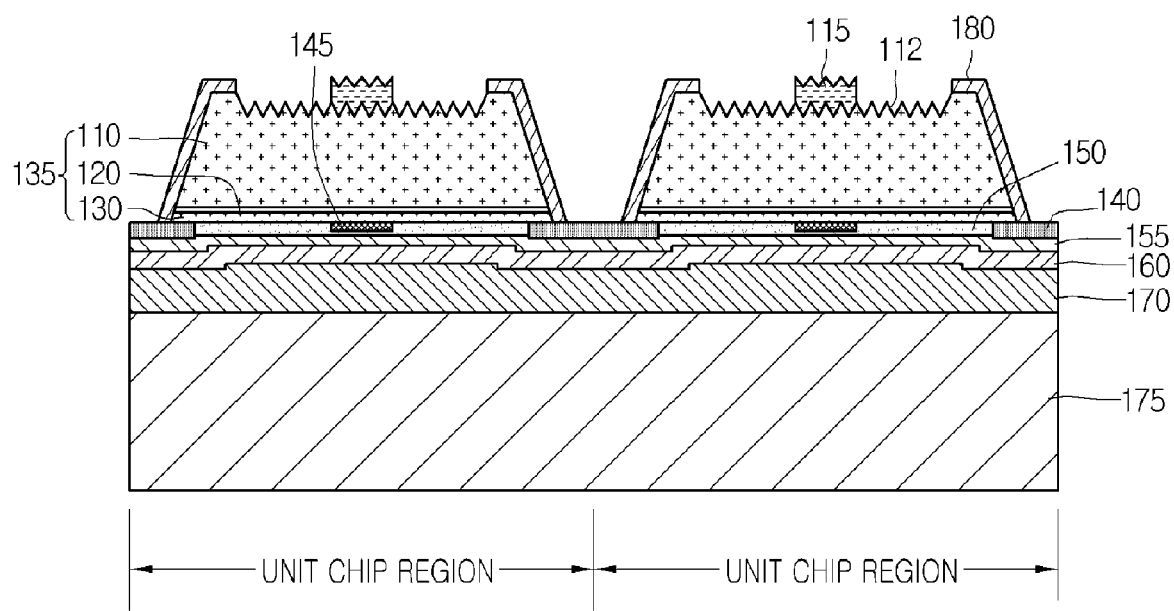

Referring to FIG. 11, the passivation layer 180 is formed on the protective layer 140 and the light emitting structure layer 135, thereby selectively removing the passivation layer 180 so that the upper surface of the first conductive type semiconductor layer 110 is exposed.

The roughness pattern 112 is formed on the upper surface of the first conductive type semiconductor layer 110 to improve the light extracting efficiency and the electrode 115 is formed on the roughness pattern 112. The roughness pattern 112 may be formed by a wet etching process or a dry etching process.

When the structure is separated into the unit chip region through the chip separating process, the plurality of light emitting devices may be manufactured.

The chip separating process may include, for example, a braking process that separates a chip by applying a physical force using a blade, a laser scribing process that separates the chip by irradiating laser to the chip boundary, an etching process that includes the wet or dry etch, etc. but is not limited thereto.

Figure 12:
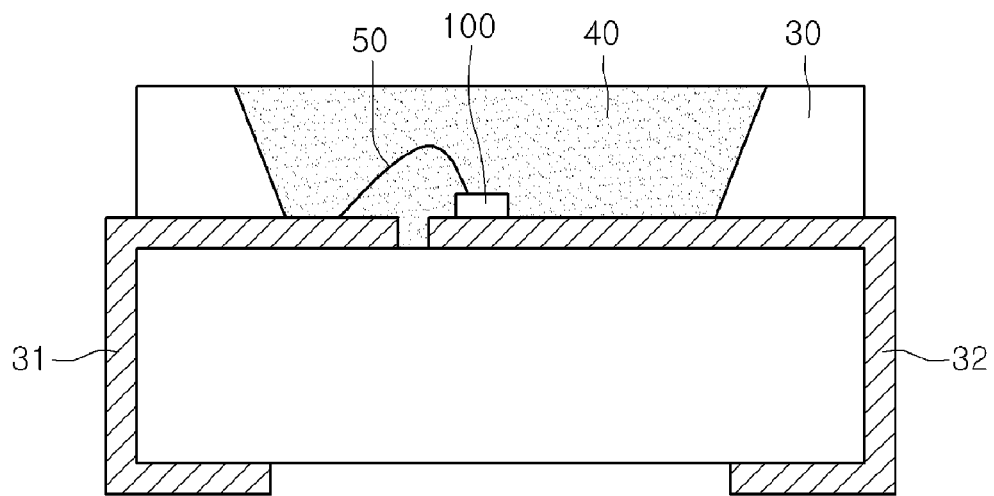
FIG. 12 is a cross-sectional view of a light emitting apparatus including a light emitting device according to an embodiment.

FIG. 12 is a cross-sectional view of a light emitting apparatus including a light emitting device according to an embodiment.

Referring to FIG. 12, the light emitting apparatus according to the embodiment includes a body 30, a first electrode 31 and a second electrode 32 that are disposed on the body 30, a light emitting device 100 that is disposed on the body 30 and is electrically connected to the first electrode 31 and the second electrode 32, and a sealing layer 40 that surrounds the light emitting device 100.

The body 30 may made including a silicon material, a synthetic resin material, or a metal material and may have a cavity whose side surface is inclined.

The first electrode 31 and the second electrode 32 are separated from each other and power is supplied to the light emitting device 100. In addition, the first electrode 31 and the second electrode 32 can reflect light generated from the light emitting device 100 to increase light efficiency and emit heat generated from the light emitting device 100 to the outside.

The light emitting device 100 may be installed on the body 30 or installed on the first electrode 31 or the second electrode 32.

The light emitting device 100 may be electrically connected to the first electrode 31 and the second electrode 32 by any one of the wire manner, a flip chip manner, and a die bonding manner. The embodiment shows the case where the light emitting device 100 is electrically connected to the first electrode 31 through the wire 50 and is electrically connected thereto by directly contacting the second electrode 32.

The sealing layer 40 can surround the light emitting device 100 to protect the light emitting device 100. In addition, the sealing layer 40 can include a phosphor to change a wavelength of light emitted from the light emitting device 100.

The embodiments can provide the light emitting device having a new structure, the method for manufacturing a light emitting device, and the light emitting apparatus.

The embodiments can provide the light emitting device with improved light extracting efficiency, the method for manufacturing a light emitting device, and the light emitting apparatus.

The embodiments can provide the light emitting device that can prevent materials used as the reflecting layer from diffusing to the light emitting structure layer, the method for manufacturing a light emitting device, and the light emitting apparatus.

Any reference in this specification to "one Embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a light emitting device, the method comprising:
   forming a light emitting structure layer;
   forming a protective layer on a first portion of the light emitting structure layer;
   forming an ohmic contact layer on a second portion of the light emitting structure layer;

forming an adhesion layer including an oxide-based material on the ohmic contact layer, wherein a portion of the adhesion layer contacts a portion of the protective layer; and forming a reflecting layer on the adhesion layer.

2. The method according to claim 1, wherein the adhesion layer includes AZO (Al—ZnO) or IZO (In—ZnO).

3. The method according to claim 2, wherein the AZO or IZO has a content of ZO (Zinc-Oxide) of about 50% to about 80%.

4. The method according to claim 1, further comprising,
forming a conductive supporting substrate on the reflective layer;
performing an isolation etching to the light emitting structure layer along a boundary of a unit chip region; and
forming an electrode on the light emitting structure layer.

5. The method according to claim 4, further comprising forming a seed layer for plating between the conductive supporting substrate and the reflective layer.

6. The method according to claim 1, wherein a lateral surface of the ohmic contact layer is surrounded by the protective layer.

7. The method according to claim 1, wherein the protective layer includes at least one of $SiO_2$, $Si_3N_4$, ITO, $TiO_2$, AZO, and IZO.

8. The method according to claim 1, wherein the reflecting layer includes at least one of Ag, Al, Ag—Pd—Cu, and Ag—Cu.

9. The method according to claim 1, wherein the protective layer is formed at a peripheral region of the ohmic contact layer between the light emitting structure layer and the adhesion layer.

10. The method according to claim 1, wherein the protective layer is partially overlapped with the light emitting structure layer.

11. The method according to claim 1, wherein the protective layer includes at least one of a transparent conductive oxide film, Ti, Ni, Pt, Pd, Rh, Ir, and W.

12. The method according to claim 1, further comprising forming a current blocking layer between the ohmic contact layer and the light emitting structure layer.

13. The method according to claim 1, wherein the reflecting layer includes at least one of Ag, Ni, Al, Rh, Pd, Ir, Ru, Mg, Zn, Pt, Cu, Au, and Hf.

14. The method according to claim 1, wherein the ohmic contact layer includes at least one of ITO, IZO, IZTO, IAZO, IGZO, IGTO, AZO, ATO, IrO, RuO, RuO/ITO, Ni, Ag, Ni/IrO/Au, and Ni/IrO/Au/ITO.

15. The method according to claim 1, wherein the light emitting structure layer includes a first conductive type semiconductor layer, a second conductive type semiconductor layer, and an active layer between the first conductive type semiconductor layer and the second conductive type semiconductor layer.

16. The method according to claim 1, wherein the adhesion layer is formed to contact the ohmic contact layer and the reflecting layer.

17. A method for fabricating a light emitting device, the method comprising:
forming a light emitting structure layer;
partially forming a conductive protective layer corresponding to a unit chip region on the light emitting structure layer;
forming an ohmic contact layer on the light emitting structure layer;
forming an adhesion layer including an oxide-based material on the ohmic contact layer and the conductive protective layer, wherein a portion of the adhesion layer contacts the conductive protective layer;
forming a reflecting layer on the adhesion layer;
forming a conductive supporting substrate on the reflective layer;
performing an isolation etching to the light emitting structure layer along the unit chip region; and
forming an electrode on the light emitting structure layer.

18. The method according to claim 17, wherein the adhesion layer includes AZO (Al—ZnO) or IZO (In—ZnO).

19. The method according to claim 18, wherein the AZO or IZO has a content of ZO (Zinc-Oxide) of about 50% to about 80%.

20. The method according to claim 17, further comprising forming a current blocking layer between the ohmic contact layer and the light emitting structure layer.

* * * * *